United States Patent
Hotta et al.

(10) Patent No.: US 9,210,829 B2
(45) Date of Patent: Dec. 8, 2015

(54) MOUNTING STRUCTURE FOR POWER CONTROL UNIT

(75) Inventors: Yutaka Hotta, Chiryu (JP); Tatsuyuki Uechi, Toyoake (JP)

(73) Assignees: TOYOTA JIDOSHA KABUSHIKI KAISHA, Aichi-ken (JP); AISIN AW CO., LTD., Aichi-ken (JP)

(*) Notice: Subject to any disclaimer, the term of this patent is extended or adjusted under 35 U.S.C. 154(b) by 323 days.

(21) Appl. No.: 13/980,498

(22) PCT Filed: Jan. 23, 2012

(86) PCT No.: PCT/JP2012/051335
§ 371 (c)(1),
(2), (4) Date: Jul. 18, 2013

(87) PCT Pub. No.: WO2012/105353
PCT Pub. Date: Aug. 9, 2012

(65) Prior Publication Data
US 2013/0301220 A1    Nov. 14, 2013

(30) Foreign Application Priority Data

Jan. 31, 2011  (JP) .................................. 2011-017687

(51) Int. Cl.
*H05K 7/20* (2006.01)
*H02K 11/00* (2006.01)
*H02K 9/19* (2006.01)

(52) U.S. Cl.
CPC ........ *H05K 7/20218* (2013.01); *H02K 11/0073* (2013.01); *H05K 7/20927* (2013.01); *H02K 9/19* (2013.01)

(58) Field of Classification Search
CPC .................................. H05K 7/20; H02K 9/19
USPC .......................... 361/699, 713, 716; 180/65.1
See application file for complete search history.

(56) References Cited

U.S. PATENT DOCUMENTS

| | | | | |
|---|---|---|---|---|
| 5,491,370 A  * |  2/1996 | Schneider et al. | ............... | 310/54 |
| 5,585,681 A  * | 12/1996 | Bitsche | ............................ | 310/54 |
| 8,397,845 B2 * |  3/2013 | Yoshida | ........................ | 180/65.1 |
| 2004/0226761 A1* | 11/2004 | Takenaka et al. | ............ | 180/65.1 |
| 2010/0175933 A1 |  7/2010 | Yoshida | | |

FOREIGN PATENT DOCUMENTS

| | | |
|---|---|---|
| JP | 2007-166803 A | 6/2007 |
| JP | 2008-072813 A | 3/2008 |
| JP | 2010-057266 A | 3/2010 |

* cited by examiner

*Primary Examiner* — Dion R Ferguson
*Assistant Examiner* — Mandeep Buttar
(74) *Attorney, Agent, or Firm* — Sughrue Mion, PLLC (57) ABSTRACT

A PCU (20) comprises an anchoring pedestal (22) that is attached to the opening of a transaxle and that has been molded from resin so as to be formed integrally with a terminal block (21); a cooler (27) that is disposed on top of the anchoring pedestal (22) and that has a power module; a heat-conductive board stay (14) connected to the top of the cooler (27); and a control board (29) connected to the top of the board stay (14). This mounting structure is configured such that by disposing the board stay (14) near a cooling tube (17a) for introducing coolant cooled by a radiator and by attaching the stay to the cooler (27) via a heat-dissipating sheet (61a) for actively conducting heat from the control board, the control board (29) is cooled by the coolant before the coolant has absorbed heat. Thus, the pressure elevation converter and inverter that form the power control unit and the motor are housed as a single component inside one case and the coolability of the control board disposed at the top of the power control unit can be ensured.

4 Claims, 9 Drawing Sheets

MOUNTING STRUCTURE FOR POWER CONTROL UNIT

CROSS REFERENCE TO RELATED APPLICATIONS

This application is a National Stage of International Application No. PCT/JP2012/0535, filed on Jan. 23, 2012, which claims priority from Japanese Patent Application No. 2011-017687, filed on Jan. 31, 2011, the contents of all of which are incorporated herein by reference in their entirety.

TECHNICAL FIELD

The present invention relates to a power control unit mounting structure employed to mount, on a motor case wherein a rotary electric machine that drives a vehicle is incorporated, a power control unit that controls the rotary electric machine.

BACKGROUND ART

Conventionally, there have been known, for example, electric vehicles, for which a drive force generated by a rotary electric machine, such as a motor generator, is employed to drive the vehicles, hybrid vehicles that combine a rotary electric machine with an engine that is an internal combustion engine, and fuel cell vehicles, for which electric power generated by a fuel cell is employed to drive the vehicles. These vehicles are equipped with a PCU (Power Control Unit) that includes a boost converter and an inverter for receiving electric power supplied by a battery and for controlling the transmission of electric power to a motor generator (hereinafter referred to also as a motor). It should be noted that the power control unit is also called a PCU.

Generally, supply of a high voltage is required for efficient operation of a motor, and, for example, a hybrid vehicle is well known, on which a boost converter that increases a battery voltage from about 200 V to about 600 V is mounted. The boost converter includes switching elements and a reactor connected to the switching elements, and the reactor includes a core, such as an icon core, made of a magnetic material, and a coil provided for the core. Further, when the boost converter controls the ON/OFF states of the switching elements, the reactor is permitted to accumulate or discharge the electric power, and a voltage supplied from the battery can be increased, and the increased voltage can be supplied to the inverter. At this time, the core of the reactor generates heat in association with electromagnetic energy conversion, and the coil is heated by the Joule heat of a conductive current. In a case wherein heat dissipation is not appropriately performed, a rise in the temperature of the reactor would occur, and the voltage conversion efficiency for the boost converter would be reduced, and therefore, appropriate dissipation of heat from the reactor is required. Thus, as for heat release from the reactor, there are heat dissipation techniques; for example, using a cooling fin provided for the reactor, and using a liquid coolant.

In patent document 1, a drive unit for a hybrid vehicle, which is equipped with a boost converter that employs a reactor as a constituent, is disclosed. According to the drive unit described in patent document 1, when an inverter and a motor are arranged together in a single case, lubricating oil pumped up by rotation of a motor generator is introduced into a housing chamber where a reactor is housed, and the lubricating oil thus accumulated in the housing chamber is employed to cool the reactor in order to encourage heat dissipation from the reactor.

Figure 8:
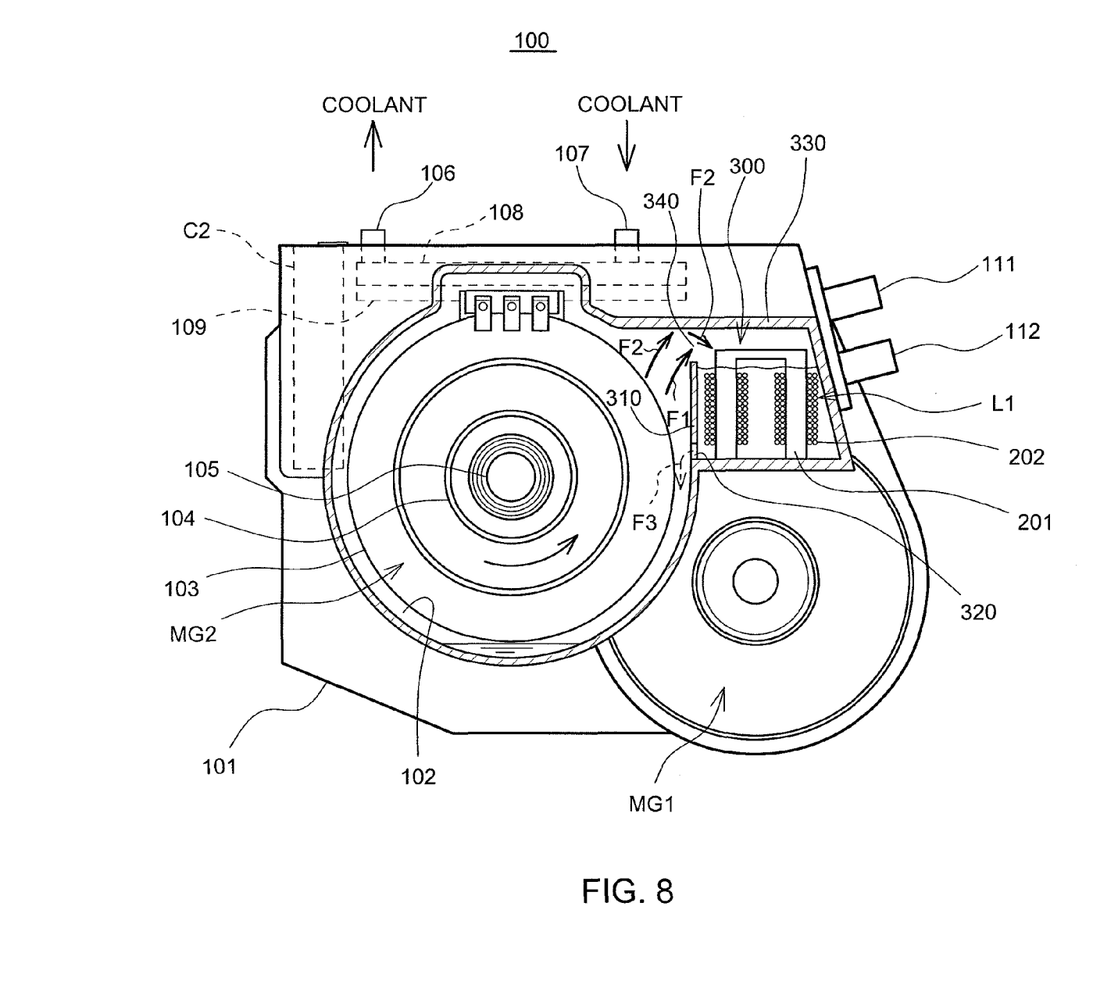
FIG. 8 is a schematic diagram showing the overview of a conventional drive unit.

A conventional drive unit 100 is shown in FIG. 8, and a motor generator MG2 and a reactor L1 in cross section are shown in front, while a capacitor C2, a cooler 108, a power element board 109, and a motor generator MG1 are shown behind the motor generator MG2 and the reactor L1. In accordance with rotation of the motor generator MG, lubricating oil is pumped up, as indicated by arrows F2 and F2, and is passed through a housing chamber opening 340 and is introduced into a reactor housing chamber 300. The thus introduced lubricating oil cools the reactor L1, and is discharged from an oil drain hole 320 to an opening 102, as indicated by F3. With this arrangement, the coolability of the reactor L1 can be obtained.

CITATION LIST

Patent Document

PTL 1: Japanese Patent Laid-Open No. 2008-72813

SUMMARY OF INVENTION

Technical Problem

As described above, according to the technique for employing lubricating oil to cool the reactor L1, in a case wherein the motor generators MG1 and MG2, the boost converter that drives these motors, and the inverter are housed together to be provided as a single component, the temperature of the lubricating oil is adjusted by employing a coolant that cools the motor case and the engine case, and therefore, in the normal operating state, the water temperature and the oil temperature are substantially the same (e.g., about 85° C. to about 90° C.). Meanwhile, in the heavy-duty operating state, since heat is rapidly generated by the engine and the motor generators, the oil temperature becomes higher than the water temperature, and therefore, not only cooling of the reactor, but also conduction of heat to the boost converter and the inverter that are arranged near the reactor should be taken into account.

The boost converter, the inverter, etc., each include a power module and a control board that controls the power module, and cooling of the power module and the control board is performed based on the water temperature of a cooler 107 that belongs to a cooling system different from the cooling system of the engine case. Normally, a large radiator and a fan are employed to cool water; however, the water temperature is increased in the heavy-duty operating state, and the endothermic effect is reduced. Furthermore, in a case wherein a quantity of heat that exceeds the capacity of the cooler 107 is transferred to the cooler 107, the power module and the control board become overheated. If the heatproof temperature is increased for the components and parts of a control unit in order to endure such overheating, the manufacturing costs would be increased, or the running performance of the vehicle would be degraded due to the output restriction control that is accompanied by the increase of the temperature of the power elements.

Particularly, in the above-described case wherein the boost converter and the inverter that constitute the motor and the power control unit are arranged together in the same case, the temperature of the power control unit will be increased due to heat transferred from the case, heat transferred from the die-case aluminum cover that covers the power control unit, and heat of convective air currents inside the cover. Since the control board is located in the upper portion of the power control unit, and heat tends to be collected there, special consideration for cooling is required.

Therefore, one objective of the present invention is to provide a mounting structure, for a power control unit (PCU), wherein a boost converter and an inverter that are constituents of the power control unit are housed in a single case to be provided as one component, so that cooling of the control board arranged in the upper portion of the power control unit can be obtained.

Solution to Problem

In order to achieve the above-described objective, for a power control unit mounting structure, according to the present invention, wherein a power control unit that controls a rotary electric machine that drives a vehicle is mounted on a motor case in which the rotary electric machine is housed, the power control unit includes an anchoring pedestal, molded by employing a resin, that is attached to an opening of the motor case, a cooler that is disposed on the anchoring pedestal, and that has a power module, a heat-conductive board mounting base connected to a top of the cooler, a control board connected to a top of the board mounting base, and a cover that is made of a thin metal plate and covers the entire power control unit; and a transfer of heat from the motor case to the power control unit is restricted by the anchoring pedestal and the cover to prevent increase of a temperature for the control board. With this structure, since the anchoring pedestal suppresses heat transferred from the motor case, an increase in the temperature of the power control unit can be reduced.

Further, the power control unit mounting structure of the present invention is characterized in that: the board mounting base attached to the cooler is connected to a vicinity of a coolant introduction side so as to enable a transfer of heat, and the control board is connected so as to enable a transfer of heat via the board mounting base to the cooler. Since the control board is cooled by employing the coolant that does not yet absorb heat, the temperature rise of the control board can be suppressed.

Furthermore, the power control unit mounting structure of the present invention is characterized in that:

the anchoring pedestal includes a thin plate, made of metal, for suppressing a transfer of heat between the cooler and the anchoring pedestal, and fixing means for fastening together the cooler, the thin plate, and the anchoring pedestal; and the thin plate defines a space in conjunction with the cooler, and is to be cooled by the cooler. As described above, since an insulating chamber is formed by additionally providing the thin plate, a transfer of heat from the anchoring pedestal can be suppressed, and the space can be divided.

Moreover, the power control unit mounting structure of the present invention is characterized in that:

the cover is mounted on a flange portion of the motor case arranged to enclose the anchoring pedestal, and is employed to suppress a transfer of heat from the motor case to the power control unit. Thus, not only can heat be suppressed by employing a thin plate cover, but also, the weight of the cover and the manufacturing cost can be reduced.

Advantageous Effects of Invention

When there is employed the power control unit (PCU) mounting structure of the present invention, wherein the boost converter and the inverter, both of which are constituents of the power control unit, are housed together in a single case, coolability of the control board arranged on the control unit can be obtained.

DESCRIPTION OF EMBODIMENT

The best mode for carrying out the present invention (hereinafter referred to as an embodiment) will now be described while referring to the drawings.

Figure 1:
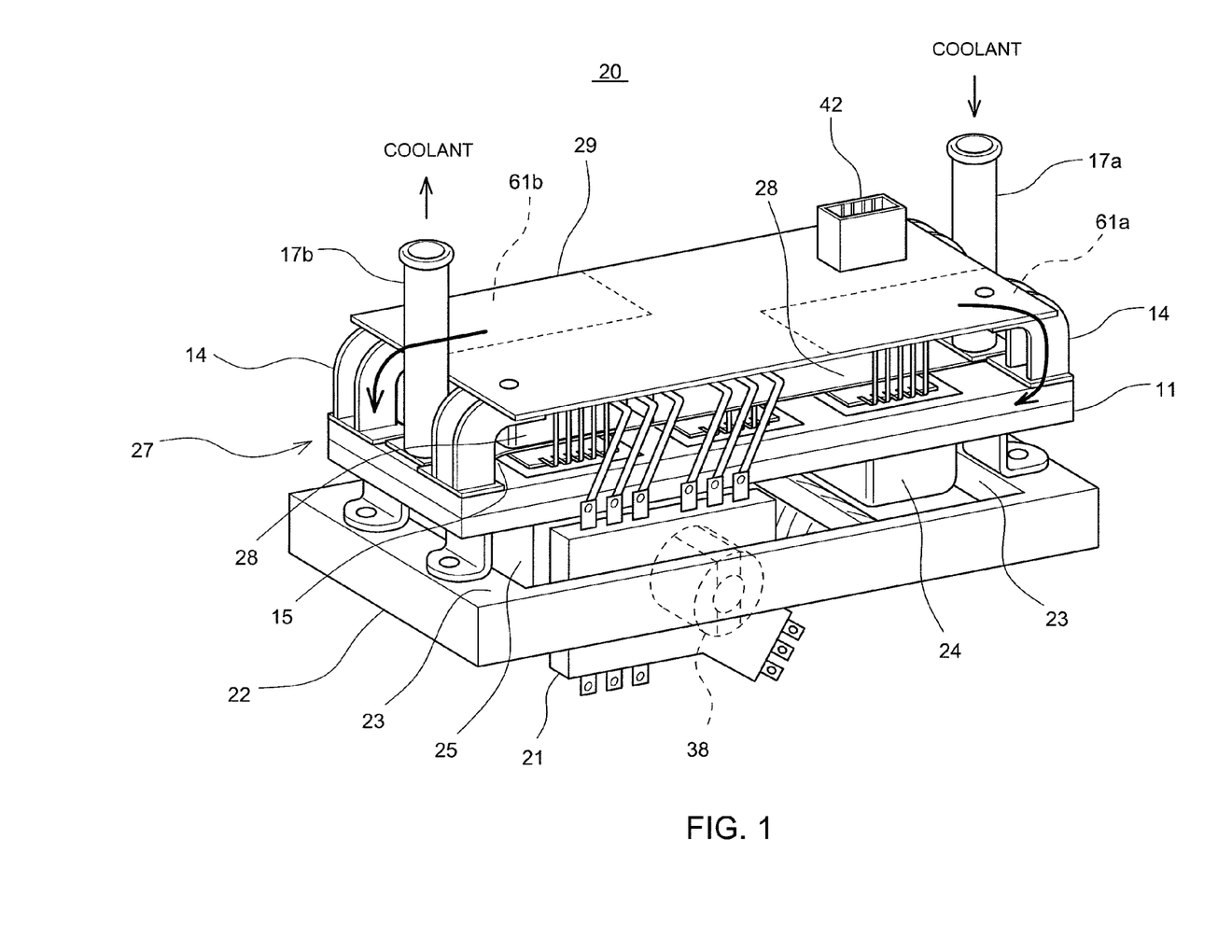
FIG. 1 is a perspective view of a PCU for a power control unit mounting structure according to one embodiment of the present invention.
Figure 2A:
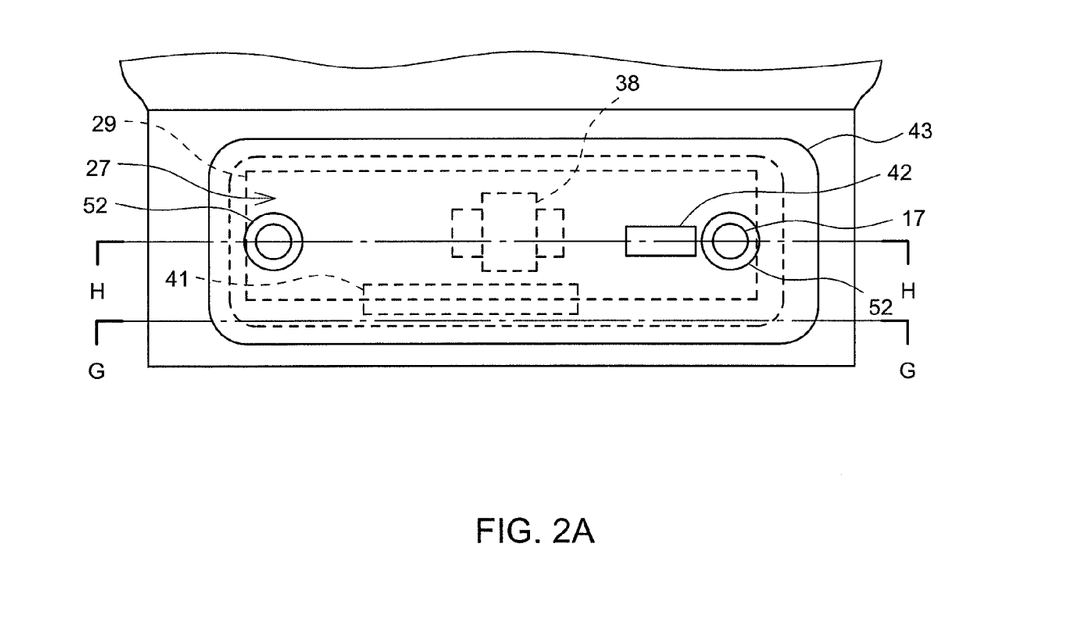
FIG. 2A is a top view of a drive unit for mounting a power control unit (PCU) according to the present invention.
Figure 2B:
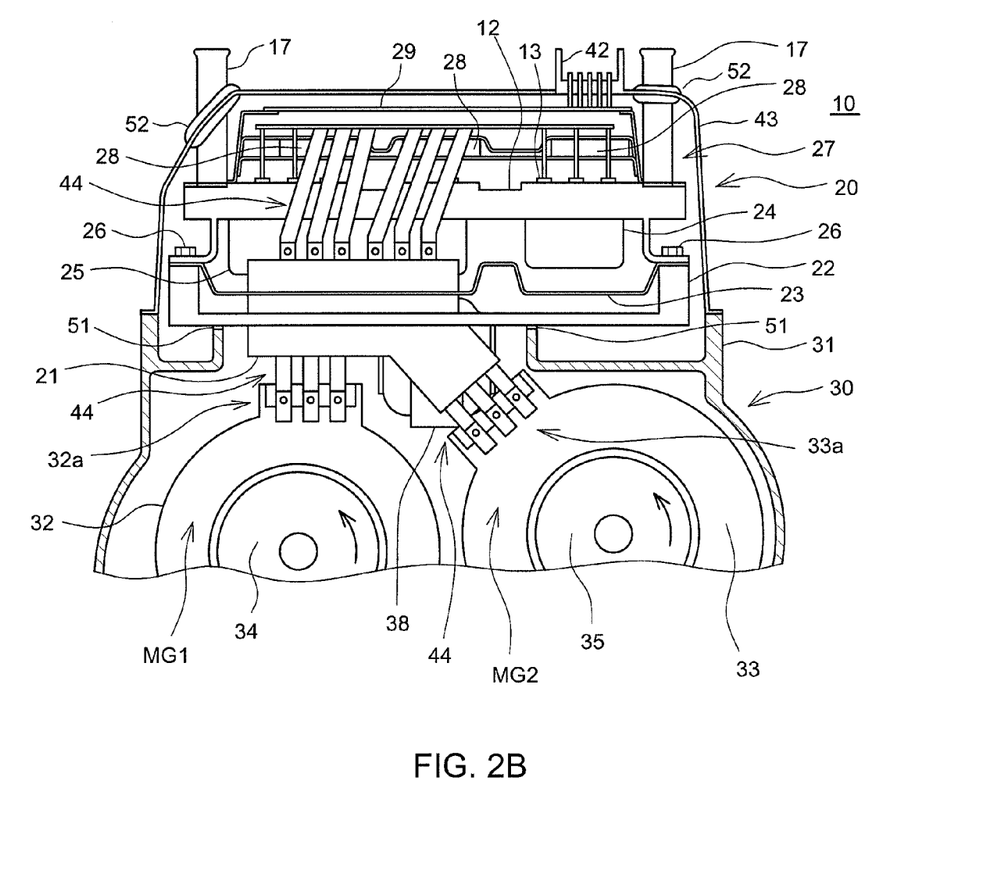
FIG. 2B is a cross-sectional view taken along a line G-G in FIG. 2A.

FIG. 1 is a perspective view of a PCU 20 employed for a power control unit mounting structure, and the overview of a drive unit 10 on which the power control unit (PCU 20) in FIG. 1 is to be mounted is shown in FIG. 2A and FIG. 2B. It should be noted that FIG. 2A is a top view of the drive unit 10, and FIG. 2B is a cross-sectional front view taken along a line G-G in FIG. 2A. First, the general structure of the drive unit 10 will be briefly described by reference to FIG. 2B.

As shown in FIG. 2B, the drive unit 10 includes: a transaxle 30 that has motor generators MG1 and MG2, which are connected to an engine via a power transfer unit; an anchoring pedestal 22, made of a resin, that is disposed to cover the opening of a transaxle case 31; a thin plate 23, made of steel sheet, that is arranged on the anchoring pedestal 22; a cooler 27 that is disposed on the thin plate 23; a smoothing capacitor 28 arranged on the cooler 27; a control board 29 arranged on the smoothing capacitor 28; and a cover 43, made of steel sheet, that covers these components. The cooler 27 includes: resin parts provided on the upper face; aluminum parts provided on the lower face; and a heat-conductive base 12, for which a fin is formed inside, and which is attached to the resin parts on the upper face, and a DC/DC converter 25 and a filter capacitor 24 are arranged on the lower face of the cooler 27, while power elements 13 are arranged, via the heat conductive base 12, on the upper face of the cooler 27. A control board 29 is located above the cooler 27, and an external connector 42 is provided for the upper face of the control board 29. The cover 43 is attached, by means of bolts, to the flange portion of the transaxle 30, and rubber rings 52 are provided at the gaps between cooling tubes 17 of the cooler 27 and the cover 43. A reactor 38 is arranged on the lower face of the anchoring pedestal 22, and is to be cooled by splashing lubricating oil as the motor generators MG1 and MG2 housed in the transaxle case 31 are rotated.

As shown in FIG. 2B, the anchoring pedestal 22 has a terminal block 21, and bus bars 44 are extended from stator coil terminals 32a and 33a of the motor generators MG1 and MG2, and branch and are connected, via the terminal block 21, to the plurality of power elements 13 that are fixed to the cooler 27. Therefore, part of heat dissipated from the power elements 13 is released via the bus bars 44 to the PCU case. Further, the anchoring pedestal 22 is connected via a surface seal 51 to the transaxle case 31, so that the transaxle 30 is sealed by the anchoring pedestal 22. With this arrangement, since the PCU 20 of this embodiment is connected by the bus bars 44 that are connected via the terminal block 21, instead of by a wire harness that is connected to the motor generators MG1 and MG2, the number of required parts is reduced. Furthermore, since the anchoring pedestal 22 that separates the transaxle 30 from the PCU 20 is formed of a resin that is less heat conductive than the resin employed for the transaxle case 31, conduction of heat from the transaxle 30 to the PCU 20 can be suppressed. The PCU 20 in FIG. 1 will now be described.

In FIG. 1, the PCU 20 is shown in the state wherein the cover 43 made of steel sheet in FIG. 2B that covers the PCU 20 is removed. As shown in FIG. 1, the PCU 20 includes: the anchoring pedestal 22, which is mounted to the opening of the transaxle, and is integrally formed with the block terminal 21 by employing a resin; the cooler 27 that is disposed on the anchoring pedestal 22 and has a power module; heat-conductive board stays 14 that are connected to the top of the cooler 27; and the control board 29 that is connected to the top of the board stays 14. In FIG. 1, the coolant that has not yet absorbed heat is introduced through a cooling tube 17a, and the coolant that has absorbed heat is discharged through a cooling tube 17b on the opposite side. Further, since the control board 29 is arranged in the upper portion of the PCU 20, warm air tends to be collected in the upper portion of the cover 43, and the pertinent portion tends to be filled with heat. Moreover, since a CPU is mounted on the control board 29, the temperature tends to be increased by the heat generated by the CPU. Therefore, in this embodiment, there is employed the structure wherein the board stay 14 is provided near the cooling tube 17a where the coolant that has been cooled by the radiator is introduced, and the control board 29 is mounted on the board stays 14 via a heat-dissipating sheet 61a in order to encourage conduction of heat from the control board 29, and is to be cooled by employing the coolant that has not yet absorbed heat (heat transfer paths indicated by arrows in FIG. 1). The cooling structure for the control board will be described later in detail. Next, the drive unit 10 will be described while referring to FIG. 3, which is a cross-sectional view taken along a line H-H in FIG. 2A.

Figure 3:
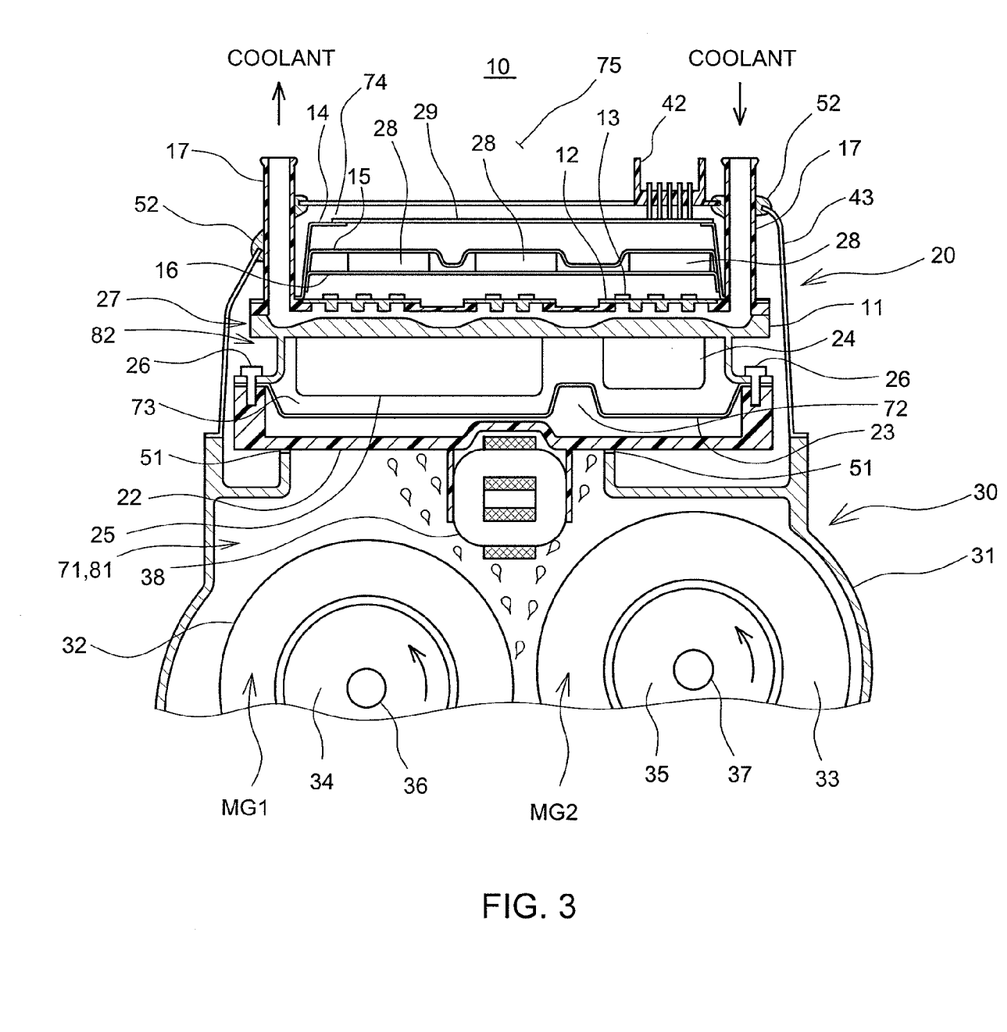
FIG. 3 is a cross-sectional view taken along a line H-H in FIG. 2A.

FIG. 3 is a cross-sectional view of the drive unit 10 taken along a line H-H in FIG. 2A, and the mounting structure for the PCU 20 will be described in detail by employing FIG. 3. No explanation will be given for the portions that have already been explained, in order to avoid redundancy. As shown in FIG. 3, the drive unit 10 includes: a transaxle chamber 81 (A chamber 71) that is provided by covering, with the anchoring pedestal 22, the transaxle case 31 that has an opening; and a PCU chamber 82 that is separated from the anchoring pedestal 22 with the cover 43. Stators 32 and 33 that are constituent components of the motor generators MG1 and MG2, rotors 34 and 35 that are arranged inside the stators and are to be rotated about shafts 36 and 37, and the reactor 38, located on the lower face of the anchoring pedestal 22, are included in the transaxle chamber 81 (A chamber 71).

The PCU chamber 82 in FIG. 3 includes: the thin plate 23, made of steel sheet, that is located above the anchoring pedestal 22; the cooler 27 located above the thin plate 23; the smoothing capacitor 28 and the control board 29 located above the cooler 27; and the cover 43, made of steel sheet, that is attached to the transaxle case 31 to cover the portion ranging from the anchoring pedestal 22 to the control board 29. The thin plate 23 and the cooler 27 are fastened to the anchoring pedestal 22 by bolts 26 to provide a B chamber 72 and a C chamber 73 that serve as heat insulating chambers in order to suppress transmission of convective heat from the transaxle 30. Furthermore, the steel sheet cover 43 mounted on the transaxle case 31 provides the C chamber 73 and a D chamber 74, which is outside the C chamber 73. Since the steel sheet cover 43 has a smaller thickness and lower thermal conductivity than a die-cast aluminum wall, conduction of heat from the transaxle 30 is restricted. Further, the cover 43 provides the D chamber 74 as a heat insulating chamber. Next, cooling means will be described.

The drive unit 10 shown in FIG. 3 has two cooling means. First cooling means employs the cooler 27 to cool the power elements 13, the DC/DC converter 25, the filter capacitor 24, the smoothing capacitor 28, and the control board 29, while second cooling means splashes lubricating oil by rotating the rotors 34 and 35 of the motor generators MG1 and MG2 about the shafts 36 and 37 to cool the reactor 38. Since general vehicles are not equipped with an oil cooler, cooling of the lubricating oil is performed by heat dissipation using an oil pan, and by employing a coolant that cools the engine. Therefore, in the heavy-duty operating state, the temperature of the lubricating oil might become higher than the temperature of the coolant. The structure for effectively cooling the control board 29 of the PCU 20 in such a state will now be described by reference to FIG. 4.

Figure 4:
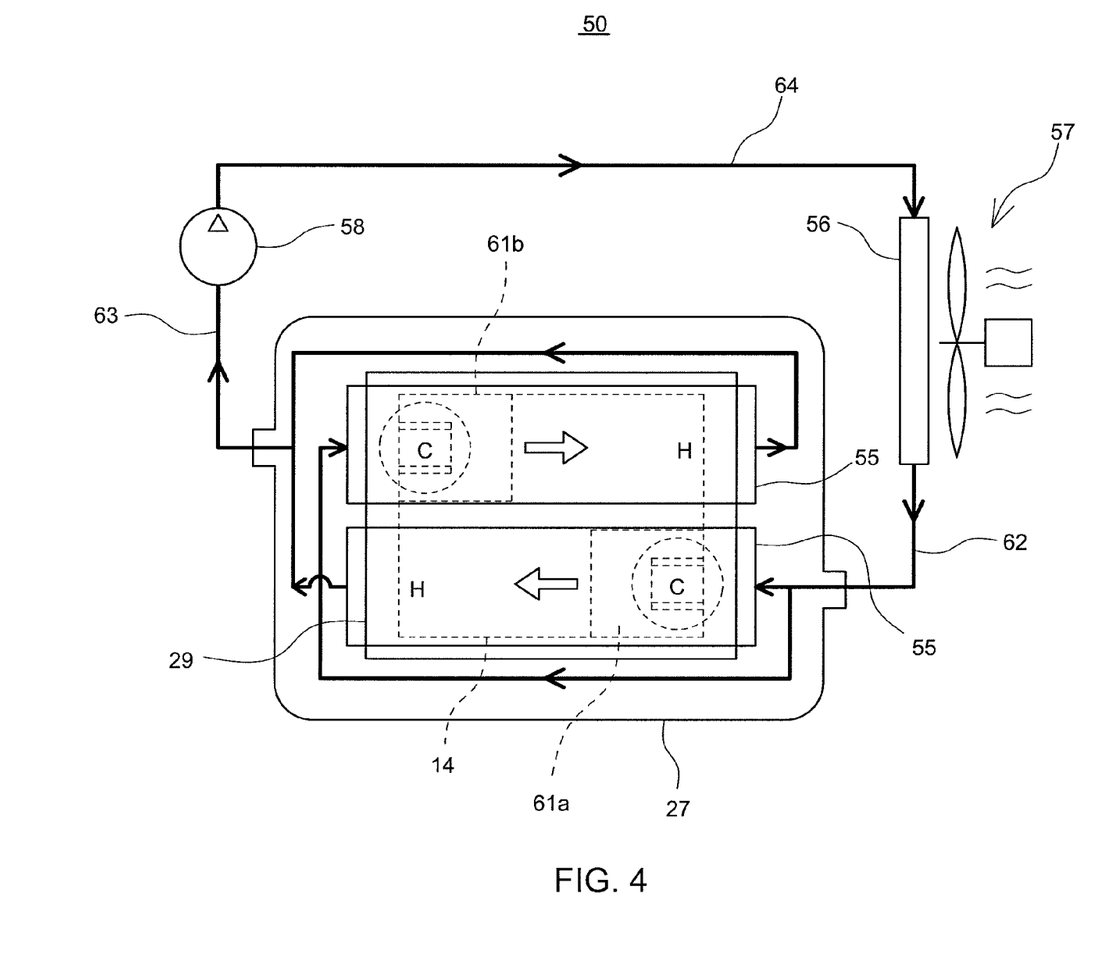
FIG. 4 is a schematic diagram for a cooling device for cooling the power control unit according to the present invention.

The overview of a cooling device 50 that cools the power control unit is shown in FIG. 4. The cooling device 50 includes: a radiator 56; a fan 57 that permits air to flow around the radiator 56; the cooler 27, to which the board stays 14 are attached, and which cools the power elements 13; a pipe 62 to introduce, into the cooler 27, the coolant that has been cooled by the radiator 56; a pump 58 that feeds by pressure, to the radiator 56, the coolant discharged from the cooler 27; a pipe 63 that connects the cooler 27 to the pump 58; and a pipe 64 that connects the pump 58 to the radiator 56. The cooler 27 in FIG. 4 includes two cooling paths 55 and flow paths, with which the flows of the coolant along the individual cooling paths 55 become counterflows of each other. Therefore, the coolant that has not yet absorbed heat is introduced into portions "C:Cold" in FIG. 4, and cooling of the control board 29 is performed via the board stays 14, which are connected to the two "C" portions to enable heat conduction, and the heat-dissipating sheets 61a and 61b that are attached to the board stays 14. It should be noted that, at portions "H:Hot" in FIG. 4, downstream of the cooling paths 55, the temperature rise for the coolant occurs due to heat absorption, and the temperature becomes high. The coolant at a high temperature is then fed by pressure to the radiator 56 by the pump 58, and is cooled again by the radiator. With this arrangement, the coolability of the control board 29 can be obtained. The change of the temperature due to heat conduction will now be described by reference to FIG. 5.

Figure 5:
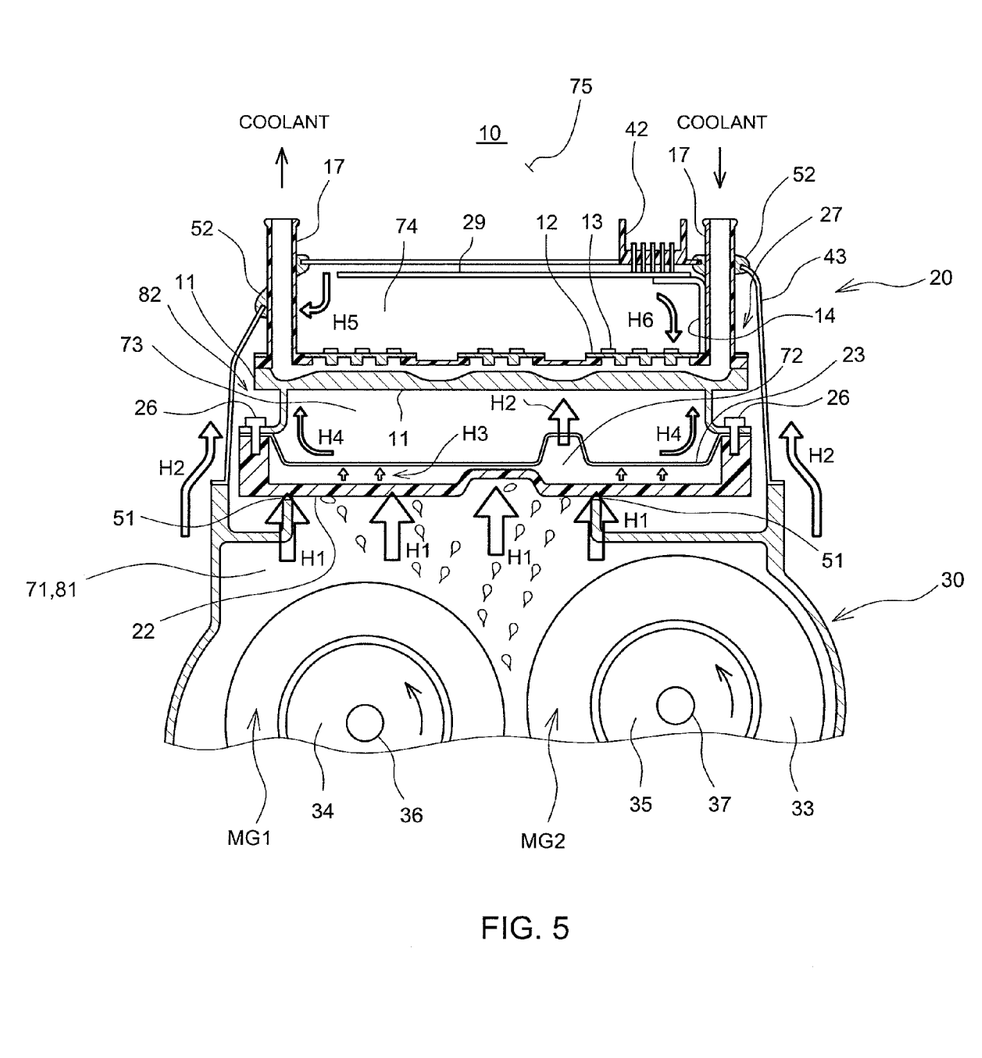
FIG. 5 is an explanatory diagram for explaining the individual housing chambers for the drive unit for mounting the power control unit according to the present invention.

For the drive unit 10 where the power control unit is mounted, the A chamber 71, the B chamber 72, the C chamber 73, the D chamber 74, and an engine compartment 75, quantities of heat H3 to H5 transferred to or from the B, C and D chambers 72 to 74, and quantities of heat H1, H2 and H6 transferred from or to the anchoring pedestal 22, the thin plate 23, and the board stays 14 are shown in FIG. 5. The individual quantities of heat transferred (H1 to H6) are indicated by outline arrows in FIG. 5, and the directions indicated by these arrows represent the directions of transfer of heat. It should be noted that the individual components of the power control unit are not shown in FIG. 5.

Figure 6:
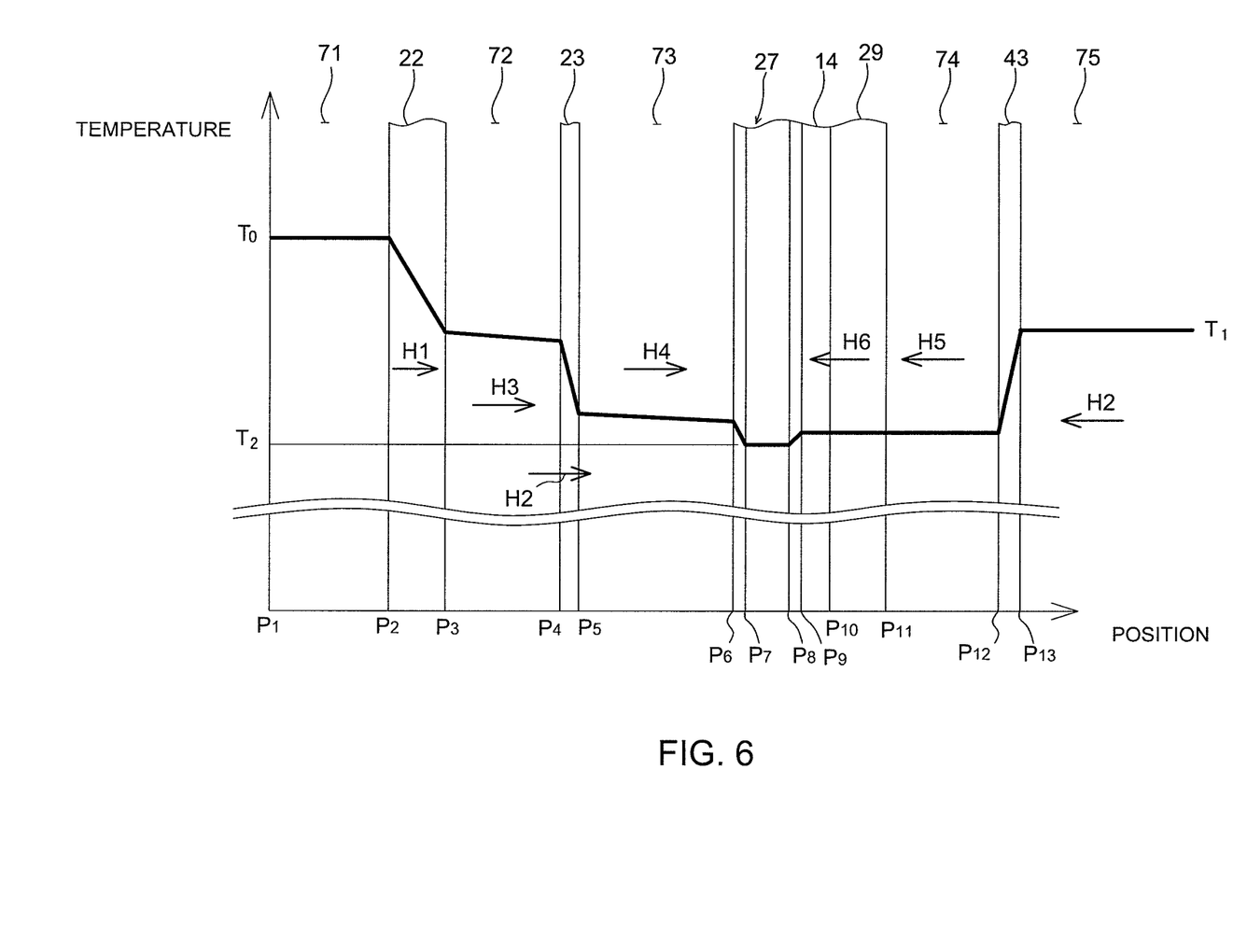
FIG. 6 is a temperature graph showing the overview of temperatures for the individual housing chambers in FIG. 5.

FIG. 6 is a temperature graph showing the outline of the temperatures for the individual chambers 71 to 75, the anchoring pedestal 22, the thin plate 23, the board stays 14, and the cooler 27 in FIG. 5, and indicating a temperature distribution especially for a case wherein a temperature $T_0$ of the lubricating oil is higher than a temperature $T_2$ of the coolant in the heavy-duty operating state. The horizontal axis in FIG. 6 specifically represents a heat transfer path from the A chamber 71 to the engine compartment 75, and the segment from a position $P_1$ to a position $P_2$ indicates the A chamber 71, the segment from the position $P_2$ to a position $P_3$ indicates the anchoring pedestal 22, the segment from the position $P_3$ to a position $P_4$ indicates the B chamber 72, the segment from the position $P_4$ to a position $P_5$ indicates the thin plate 23, the segment from the position $P_5$ to a position $P_6$ indicates the C chamber 73, the segment from the position $P_6$ to a position $P_9$ indicates the cooler 27, the segment from the position $P_9$ to a position $P_{10}$ indicates the board stays 14, the segment from the position $P_{10}$ to a position $P_{11}$ indicates the control board 29, the segment from the position $P_{11}$ to a position $P_{12}$ indicates the D chamber 74, the segment from the position $P_{12}$ to a position $P_{13}$ indicates the cover 43, and the segment from the position $P_{13}$ to the right indicates the engine comportment 75. Moreover, the segment from the position $P_7$ to the position $P_8$ indicates the coolant path of the cooler 27. Therefore, the temperature for the segment from the position $P_7$ to the position $P_8$ is the temperature $T_2$ of the coolant.

As shown in FIG. 6, in the heavy-duty operating state, the temperature $T_0$ of the lubricating oil in the A chamber 71 of the transaxle 30 side in FIG. 5 is higher than the temperature $T_2$ of the coolant. Therefore, when the lubricating oil is splashed inside the A chamber 71 of the transaxle case in FIG. 5, the temperature of the A chamber 71 is raised up to the temperature $T_0$ of the lubricating oil, and the surface temperature of the anchoring pedestal 22 on the A chamber 71 side is also increased near the temperature $T_0$ of the lubricating oil. Since the anchoring pedestal 22 is formed of a thermosetting resin (e.g., the specific heat of phenol resin =1.57 to 1.76 j/g·K) by insert molding so as to internally provide a bus bar, the anchoring pedestal has higher specific heat (the specific heat of aluminum=0.9 j/g·K), lower heat conductivity, and higher heat insulation than the aluminum partition wall. Therefore, only a small quantity of heat H1 is passed from the A chamber 71 via the anchoring pedestal 22 to the B chamber 72 by conduction of heat, and the temperature of the anchoring pedestal 22 on the B chamber 72 side is greatly reduced, compared with the temperature on the A chamber 71 side.

Since the B chamber 72 between the thin plate 23 and the anchoring pedestal 22 is a heat insulating chamber, only a small quantity of heat H3 is transferred through the B chamber 72, and therefore, the temperature of the B chamber 72 at the position $P_3$ on the transaxle 30 side and the temperature at the position $P_4$ on the cooler 27 side are not very much changed. Furthermore, the C chamber 73, defined by the thin plate 23 and the cooler base 11 of the cooler 27, is also a heat insulating chamber, and the quantity of heat H4 transferred via the C chamber 74 is also small. Therefore, the temperature of the C chamber 73 at the position $P_5$ on the transaxle 30 side is only slightly higher than the temperature at the position $P_6$ on the cooler 27 side, which is substantially equal to the surface temperature of the cooler 27. As described above, since the C chamber 73 is a heat insulating chamber, the temperature inside the C chamber 73 is almost equal to the surface temperature of the cooler 27. As described above, since the resin-made anchoring pedestal 22 is insulating and the B chamber 72 and the C chamber 73 are heat insulating chambers, even in a case wherein the temperature $T_0$ of the lubricating oil in the A chamber 71 on the transaxle side 30 is higher than the temperature $T_2$ of the coolant of the cooler 27, a transfer of heat from the transaxle 30 is restricted by the insulating properties of the anchoring pedestal 22, the B chamber 72, and the C chamber 73, and the temperature of the cooler 27 does not rise greatly. Further, as shown in FIG. 5, since the cover 43 that covers the PCU 20 is thinner than the transaxle case 31, the third quantity of heat H2 transferred along the partition wall of the A chamber 71 and that reaches the cover 43 is small, and therefore, the temperature of the cover 43 will not be greatly increased by conduction of heat from the A chamber 71. Further, since the outer wall of the cover 43 contacts the engine compartment 75, for which the temperature $T_1$ is lower than the temperature $T_0$ of the lubricating oil of the transaxle 30, as shown on the right side in FIG. 6, the outer surface temperature of the cover is substantially the same as the temperature $T_1$ of the engine compartment 75 that is lower than the temperature $T_0$ of the lubricating oil.

Moreover, since as well as the B chamber 72 and the C chamber 73, the D chamber 74 is a heat insulating chamber, as shown in FIG. 6, the quantity of heat transferred from the D chamber 74 is small, and thus, the temperature of the D chamber 74 at the position $P_{12}$ on the cover 43 side is not much different from the temperature of the D chamber at the position $P_{11}$ on the cooler 27 side. As described above, because of the insulating properties of the cover 43 and the D chamber 74, the quantity of heat transferred from the cover 43 to the cooler 27 is also small. Since the control board 29 is connected via the board stays 14 to the cooler 27, the quantity of heat H6 is transferred from the control board 29 to the cooler 27, and then, the control board 29 is effectively cooled by the cooler 27, and the temperature is reduced near the coolant temperature $T_2$ of the cooler 27. Further, since the board stays 14 are connected to the coolant introduction port, for which the temperature is lower than the average coolant temperature, the control board 29 can be more effectively cooled.

Figure 7:
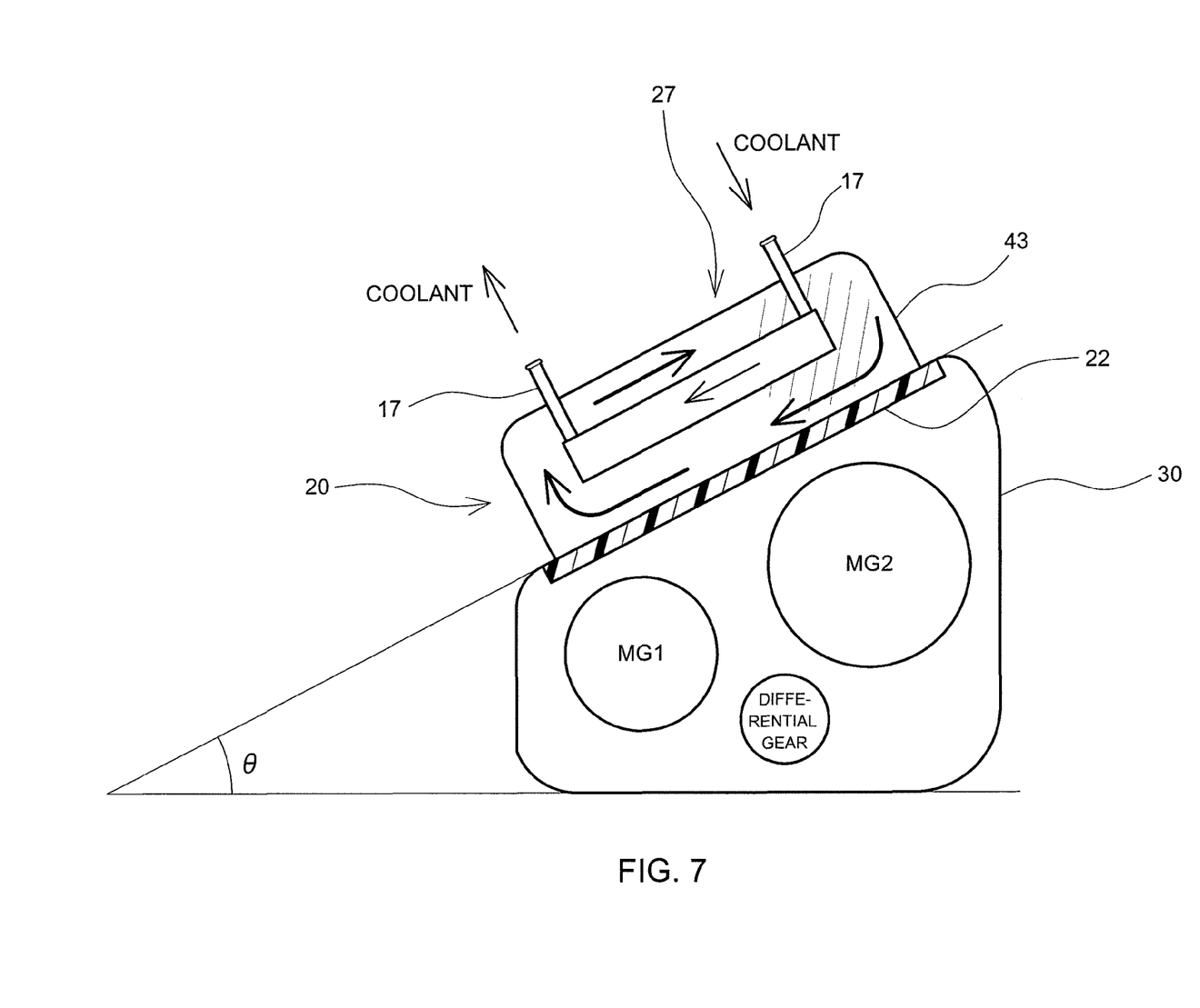
FIG. 7 is an explanatory diagram for explaining tilt-mounting of a power control unit that is different from the one of the embodiment.

FIG. 7 is a cross-sectional view of a tilt-mounted power control unit that is inclined in a direction toward the front of a vehicle. In the above described embodiment, the PCU 20 is mounted horizontally; however, the PCU 20 in FIG. 7 is mounted on the transaxle 30 at an inclination angle θ by arranging the motor generators MG1 and MG2 and a differential gear in a transaxle case. A coolant in FIG. 7 passes along the cooling pipe 17 on the upper side of the cooler 27, flows from the top to the bottom of the cooler 27, and is discharged from the lower cooling pipe 17. This flow is a counterflow, which is opposite the natural current due to heat generation.

In this embodiment, since bus bars have been employed as cables that connect the power elements to the motor generators, part of heat released from the power elements is dissipated into the PCU case. As a result, heated air tends to flow upward along the upper wall of the PCU case, and tends to be collected in the upper portion of the PCU 20. In this embodiment shown in FIG. 7, therefore, a coolant that has not yet absorbed heat is supplied from the upper portion of the PCU to cool warm air in the cooler 27, so that the cool air can flow downward in the PCU along the lower face of the PCU case, and the ambient temperature inside the PCU can be reduced by circulating the air inside. Furthermore, the convection of air will not be disturbed by the anchoring pedestal 22 that prevents entry of heat from the transaxle 30. When the PCU 20 is mounted with an inclination angle θ in this manner, and when the coolant that has not yet absorbed heat is supplied from the upper portion of the PCU 20, circulation of air inside the PCU case can be encouraged.

As described above, when the power control unit (PCU) mounting structure according to the present invention is employed wherein the boost converter and the inverter, which are constituents of the power control unit, and the motor are housed together in a single case, the B chamber 72 defined by the anchoring pedestal 22 and the thin plate 23, and the C chamber 73 and the D chamber 74, formed on both sides of the cooler 27, are provided as heat insulating chambers, and thus, convection of heat can be prevented. Further, since heat insulating property is increased by employing a low heat conductive material for the anchoring pedestal 22, and since conduction of heat from the transaxle case 31 can be suppressed by employing a thin plate for the cover 43, the control board 29 connected to the coolant introduction port can be appropriately cooled. With these functions, the temperature rise of the power control unit can be prevented, and coolability of the control board 29 can be obtained.

REFERENCE SYMBOLS LIST

10: drive unit
11: cooler base
12: heat conductive base
13: power element
14: board stay
17, 17a, 17b: cooling tube
20: PCU
21: terminal block
22: anchoring pedestal
23: thin plate
24: filter capacitor
25: DC/DC converter
26: bolt
27: cooler
28: smoothing capacitor
29: control board
30: transaxle
31: transaxle case
32, 33: stator
32a, 33a: stator coil terminal
34, 35: rotor
36, 37: shaft
38: reactor
42: external connector
43: cover
44: bus bar
50: cooling device
51: surface seal
52: rubber ring
55: cooling path
56: radiator
57: fan
58: pump
61a, 61b: heat-dissipating sheet
62, 63, 64: pipe
71: A chamber
72: B chamber
73: C chamber
74: D chamber
75: engine compartment
81: transaxle chamber
82: PCU chamber
100: drive unit
102: opening
107, 108: cooler
109: power element board
300: reactor housing chamber
320: oil drain hole
340: housing chamber opening
L1: reactor
C2: capacitor
MG1, MG2: motor generator

The invention claimed is:

1. A power control unit mounting structure, employed to mount, on a motor case in which a rotary electric machine that drives a vehicle is housed, a power control unit that controls the rotary electric machine,
wherein the power control unit includes
an anchoring pedestal, molded by employing a resin, that is attached to an opening of the motor case,
a cooler that is disposed on the anchoring pedestal, and that has a power module,
a heat-conductive board mounting base connected to a top of the cooler,
a control board connected to a top of the board mounting base,
a cover that is made of a thin metal plate and covers the entire power control unit,
a first heat insulating chamber provided between the anchoring pedestal and the cooler, and
a second heat insulating chamber provided between the cooler and the cover,
wherein a transfer of heat from the motor case to the power control unit is restricted by the anchoring pedestal, the first and second heat insulating chambers, and the cover to prevent increase of a temperature for the control board.

2. The power control unit mounting structure according to claim 1,
wherein the board mounting base attached to the cooler is connected to a vicinity of a coolant introduction side so as to enable a transfer of heat; and
wherein the control board is connected so as to enable a transfer of heat via the board mounting base to the cooler.

3. The power control unit mounting structure according to claim 2,
wherein the anchoring pedestal includes
a thin plate, made of metal, for suppressing a transfer of heat between the cooler and the anchoring pedestal, and
fixing means for fastening together the cooler, the thin plate, and the anchoring pedestal; and
wherein the thin plate defines a space in conjunction with the cooler, and is to be cooled by the cooler.

4. The power control unit mounting structure according to claim 3, wherein the cover is mounted on a flange portion of the motor case arranged to enclose the anchoring pedestal, and is employed to suppress a transfer of heat from the motor case to the power control unit.

* * * * *